United States Patent
Hsia

(10) Patent No.: US 6,274,517 B1
(45) Date of Patent: Aug. 14, 2001

(54) METHOD OF FABRICATING AN IMPROVED SPACER

(75) Inventor: Liang-Choo Hsia, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/223,196

(22) Filed: Dec. 30, 1998

(30) Foreign Application Priority Data

Sep. 14, 1998 (TW) .................................................. 87115246

(51) Int. Cl.⁷ .................................................. H01L 21/31
(52) U.S. Cl. .......................... 438/783; 438/647; 438/648; 438/649; 438/651; 438/655; 438/664; 438/669; 438/778; 427/376.2; 427/376.3; 427/377
(58) Field of Search ...................................... 438/783, 305, 438/592, 562, 918, 647, 648, 649, 651, 655, 664, 669, 778; 427/58, 96, 376.2, 377, 376.3

(56) References Cited

U.S. PATENT DOCUMENTS 5,855,962 * 1/1999 Cote et al. ........................ 427/376.2
5,856,227 * 1/1999 Yu et al. .............................. 438/305

* cited by examiner

Primary Examiner—David Nelms
Assistant Examiner—Renee' R Berry
(74) Attorney, Agent, or Firm—Jiawei Huang; J.C. Patents

(57) ABSTRACT

A method of fabricating an improved spacer comprising the steps of providing a semiconductor substrate that has a gate already formed thereon. A PNO spacer is formed on a sidewall of the gate. The method of forming the PNO spacer comprises first forming a PNO layer on the conductive layer and the semiconductor, and performing an anisotropic etching step on the PNO layer to form the PNO spacer. The step of forming the PNO layer includes chemical vapor deposition (CVD) using $PH_3$, $O_2$, $NH_3$ and $N_2$ as reagents. The step of etching the PNO layer includes plasma etching using $CF_x+O_2$ as plasma source. The material of the PNO spacer is a chemical compound $P_XN_YO_Z$ containing phosphorous (P), nitrogen (N) and oxygen (O) and does not contain silicon. Therefore, the PNO spacer can avoid erosion during etching and does not react with Ti during the Salicide process.

15 Claims, 5 Drawing Sheets

METHOD OF FABRICATING AN IMPROVED SPACER

CROSS-REFERENCE TO RELATED APPLICATION

This application claims the priority benefit of Taiwan application serial no. 87115246, filed Sep. 14, 1998, the full disclosure of which is incorporated herein by reference.

BACKGROUND OF THE INVENTION

1. Field of Invention

The present invention generally relates to semiconductor fabrication, and more particularly to a method of fabricating an improved spacer such as a Phoslon (PNO) spacer.

2. Description of Related Art

In general, in accordance with advances in semiconductor process techniques, the level of integration of integrated circuits increases and the channel lengths of MOS devices become shorter so that the operation speed of MOS devices may increase correspondingly. However, certain problems arise, for example short channel effects or hot electron effects, when the channel lengths of MOS devices shrink to a level.

FIG. 1 is a schematic, cross-sectional diagram showing a shifting of channel length between the source region and the drain region of a conventional MOS device, resulting from the short channel effect. As shown in FIG. 1, during operation of the MOS device, the source region 10 and the drain region 12 result in the depletion regions 14 and 16 respectively. The depletion regions 14 and 16 overlap part of the channel region 18. The channel length of the MOS device changes from the longer original channel length L to the shorter effective channel length L', as shown in FIG. 1. As the ratio of the overlapped region (the depletion regions 14 and 16 overlap the channel region 18) to the channel region 18 becomes larger, the effective channel length of the channel region 18 becomes shorter. If the channel length of the channel region 18 is less than approximately 1.5 $\mu$m, the channel region 18 will be electrically short and the MOS device will be always in the "ON" state. Therefore, the gate 20 of the MOS device can no longer control the MOS device.

FIG. 2 is a schematic, cross-sectional view showing electron and hole currents in a conventional MOS device resulting from the hot electron effect. The electric field (electric field=electric voltage/length) in the channel region 22 increases as the channel length of the channel region 22 shortens. As shown in FIG. 2, the electrons of the region 23, which is between the channel region 22 and the drain 24, have high energy because of the large electric field. The large electric field in the channel region 22 can accelerate the electrons of the region 23. The electrons generated from the region 23 impact the electrons near the boundary of the drain 24 to generate lots of electron-hole pairs. Therefore, the carriers (including electrons and holes) increase to result in carrier multiplication. The electrons generating from carrier multiplication, such as electron 26, are attracted to the drain 24 to increase the current of drain 24. The other the electrons also generated from carrier multiplication, such as electron 27, are injected into the gate oxide 30. The holes generating from the carrier multiplication, such as hole 28, enter the substrate 31 to generate substrate current. The other part of the holes generated from the carrier multiplication, such as hole 29, are attracted to the source 32 to add to the number of hot electrons. An increase in hot electrons results in carrier multiplication and leads to the electrical breakdown of the MOS device.

To solve the above problems, such as short channel effects or hot electron effects, a conventional lightly doped drain (LDD) structure is provided.

FIGS. 3A–3D are schematic, cross-sectional diagrams showing a sequential process of fabricating a conventional LDD structure. As shown in FIG. 3A, a polycide metal gate 34 includes polysilicon 35 and tungsten silicide 37. The field oxide layers 33 are formed beside the gate 34. The first light implanting is performed on the substrate using the gate 34 as a mask to form an N$^-$ region.

As shown in FIG. 3B, a layer 36 of silicon oxide (SiO$_2$) or silicon nitride (Si$_3$N$_4$) is formed on the gate 34 and the substrate. As shown in FIG. 3C, an anisotropic etching step is performed on the layer 36 to form spacers 38 on the sidewalls of the gate 34. As shown in FIG. 3D, the second heavy implanting is performed on the substrate using the gate 34 and the spacer 38 as masks to form an N$^+$ region 40. The N$^-$ region and the N$^+$ region 40 are combined to form LDD source/drain regions.

The drawbacks of the spacer 38 of silicon oxide (SiO$_2$) or silicon nitride (Si$_3$N$_4$) are described as follows in two conventional processes.

FIGS. 4A–4D are schematic, sequential cross-sectional diagrams showing a self-aligned silicide (Salicide) process. As shown in FIG. 4A, a gate 42 and a spacer 44 are provided. As shown in FIG. 4B, a Ti layer 46 that is about 100–200 Å thick is formed over the wafer by magnetron DC sputtering. An annealing step is performed on the Ti layer 46 to let Ti react with silicon on the surface of the gate 42 and source/drain regions to form TiSi$_2$ layer 48, as shown in FIG. 4C. A wet etching step is performed to remove the remaining Ti layer 46 to expose the TiSi$_2$ layer 48, as shown in FIG. 4D. During the annealing step, the TiSi$_2$ layer 48 sometimes forms on the spacer 44, because the spacer 44 of silicon oxide or silicon nitride also contains silicon. The TiSi$_2$ layer 48 formed on the spacer 44 can be an electrical bridge between the gate 42 and source/drain regions. Therefore, the spacer 44 cannot isolate the gate 42 and source/drain regions resulting in the MOS device's failure and a decrease in the MOS device fabrication yield.

FIGS. 5A–5B are schematic, sequential cross-sectional diagrams showing a self-aligned contact etching process. As shown in FIG. 5A, a gate 52, a spacer 54 and an LDD source/drain region 56 are provided. As shown in FIG. 5B, a dielectric layer 58 is deposited over the whole wafer. The material of the dielectric layer 58 is silicon oxide. An etching step and a depositing step are performed on the dielectric layer 58 to form a contact 60 to electrically connect one of the LDD source/drain regions 56. During the process of etching the dielectric layer 58, part of the spacer 54 is removed by etching. The erosion of the spacer 54 is especially serious for the silicon oxide spacer 54. Therefore, the gate 52 and the contact 60 are short because of the erosion of the spacer 54 and results in the MOS device's failure.

In light of the foregoing, there is a need to provide a method of fabrication an improved spacer structure.

SUMMARY OF THE INVENTION

Accordingly, the object of the present invention is to provide a method of fabricating an improved spacer. A PNO spacer is used instead of conventional silicon nitride spacer or silicon oxide spacer to improve the isolation between gate and other device structures.

Another object of the present invention is to provide a method of fabricating a PNO spacer that does not contain any silicon to avoid the $TiSi_2$ layer formed on the PNO spacer during Salicide process.

The other object of the present invention is to provide a method of fabricating a PNO spacer that is strong enough to avoid erosion during the process of etching a dielectric layer.

To achieve these and other advantages and in accordance with the purpose of the invention, as embodied and broadly described herein, the invention provides a method of fabricating an improved spacer. A semiconductor substrate is provided. A conductive layer, such as a gate, is formed on the semiconductor substrate and patterned to expose the semiconductor substrate. The gate structure includes a gate oxide layer formed on the semiconductor substrate and a polycide metal layer formed on the gate oxide layer. The polycide metal layer includes a polysilicon layer formed on the gate oxide layer and a tungsten silicide layer formed on the polysilicon layer. A PNO spacer is formed on a sidewall of the conductive layer. The method of forming the PNO spacer comprises forming a PNO layer on the conductive layer and the semiconductor substrate by deposition. In accordance with the preferred embodiment, an anisotropic etching step is performed on the PNO layer to form the PNO spacer. The step of forming the PNO layer includes chemical vapor deposition (CVD) using $PH_3$, $O_2$, $NH_3$ and $N_2$ as reagents and the step of etching the PNO layer includes plasma etching using $CF_x+O_2$ as a plasma source. The reactive temperature during PNO spacer formation is in the range of about 400–9000° C. The material of the PNO spacer is a chemical compound $P_XN_YO_Z$ containing phosphorous (P), nitrogen (N) and oxygen (O). It is of note that the PNO spacer does not contain any silicon.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The invention provides a dielectric material called PNO material for forming a spacer structure. The PNO material is a chemical compound of the form $P_XN_YO_Z$, containing phosphorous (P), nitrogen (N) and oxygen (O). Significantly, the chemical compound $P_XN_YO_Z$ does not include silicon (Si). Therefore, the spacer formed by PNO material is stronger and more stable than the conventional spacer formed from silicon oxide or silicon nitride. The PNO spacer of the invention is not eroded during the process of etching and can improve isolation between gate structure and other device structures.

Figure 6A:
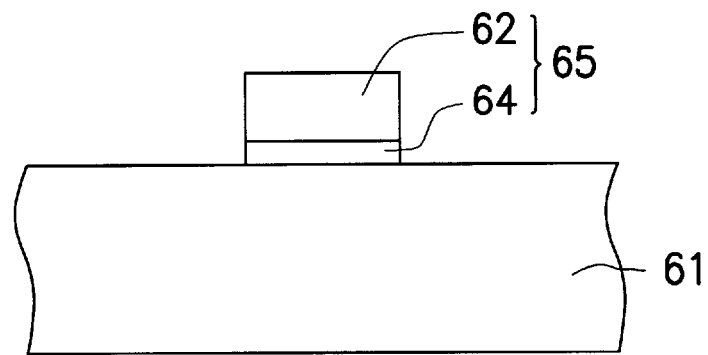
FIGS. 6A through 6C are schematic, sequential cross-sectional diagrams showing a method of fabricating a PNO spacer of the invention.
Figure 6B:
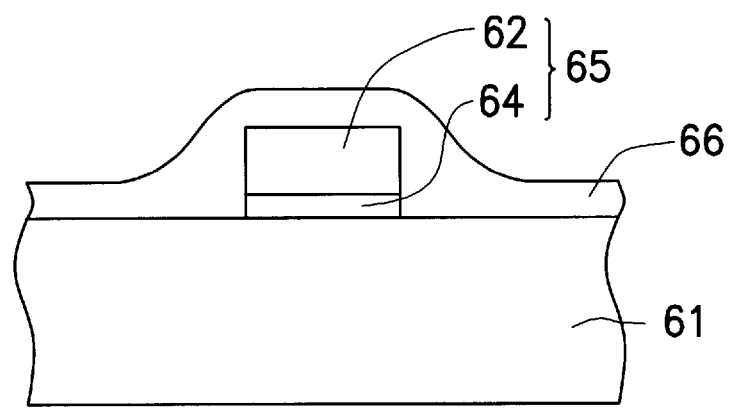
Figure 6C:
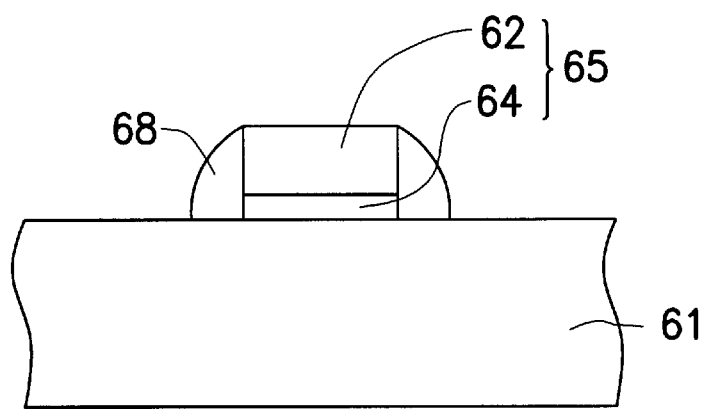

FIGS. 6A through 6C are schematic, sequential, cross-sectional diagrams showing a method of fabricating a PNO spacer of the invention. As shown in FIG. 6A, a semiconductor substrate 61 is provided. A gate 65 is formed and patterned over the semiconductor substrate 61. The gate 65 includes a gate oxide 64 and a polycide metal layer 62. The polycide metal layer 62 includes a polysilicon layer and a tungsten suicide layer (not shown).

As shown in FIG. 6B, a PNO (chemical compound $P_XN_YO_Z$) layer 66 is formed on the gate 65 and the semiconductor substrate 61 by deposition. The preferred method of forming the PNO layer 66 includes chemical vapor deposition (CVD) using $PH_3$, $O_2$, $NH_3$ and $N_2$ as reagents. The preferred reactive temperature is in the range of about 400–900° C. The chemical reactive equation is as follows:

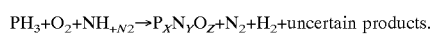

$$PH_3+O_2+NH_{+N/2} \rightarrow P_XN_YO_Z+N_2+H_2+\text{uncertain products}.$$

As shown in FIG. 6C, an anisotropic etching step is performed on the PNO layer 66 to form a PNO spacer 68. The preferred method of forming the PNO spacer 68 includes dry etching or plasma etching using $CF_x+O_2$ as a plasma source.

The PNO spacer 68 of the invention is good for the following two conventional processes, including the self-aligned silicide process and the self-aligned contact etching process.

Figure 1:
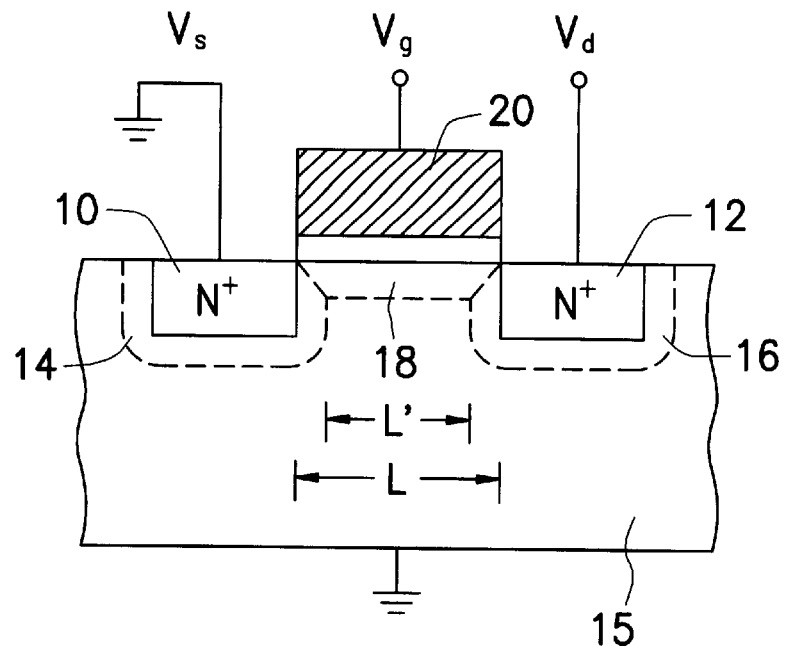
FIG. 1 is a schematic, cross-sectional diagram showing a shifting of channel length between the source region and the drain region of a conventional MOS device resulting from the short channel effects.
Figure 2:
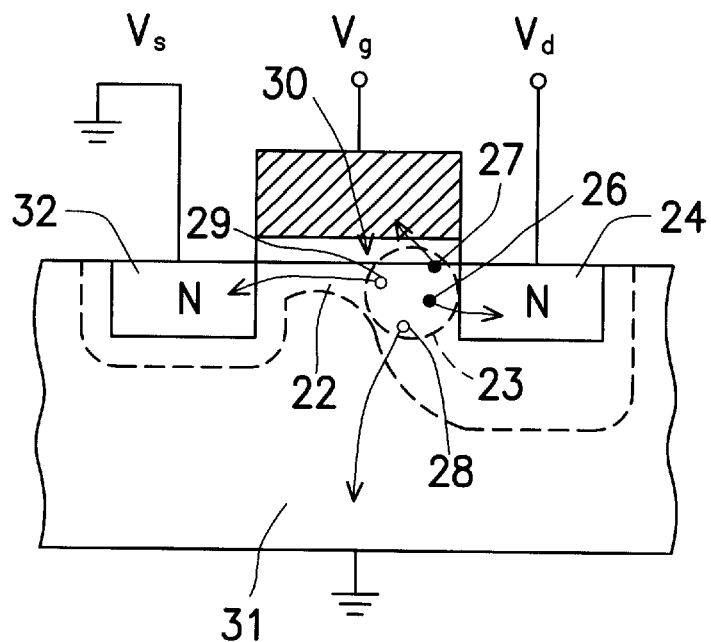
FIG. 2 is a schematic, cross-sectional view showing electron and hole currents in a conventional MOS device resulting from the hot electron effects.
Figure 3A:
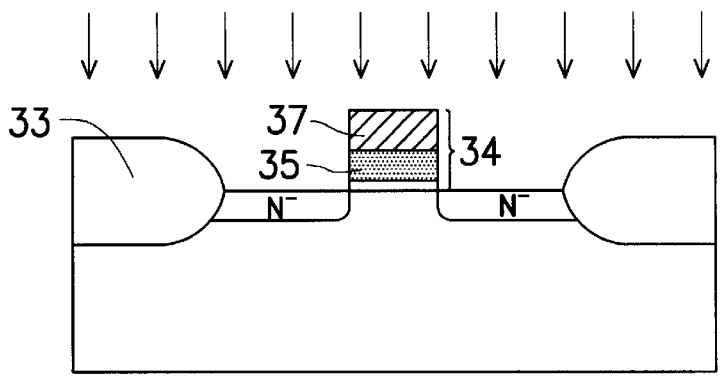
FIGS. 3A through 3D are schematic, cross-sectional diagrams showing a sequential process of fabricating a LDD structure.
Figure 3B:
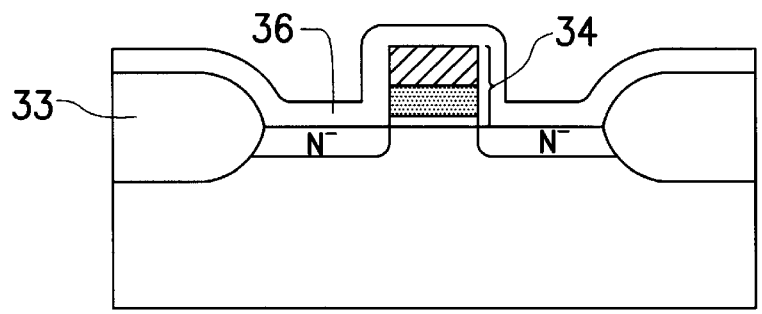
Figure 3C:
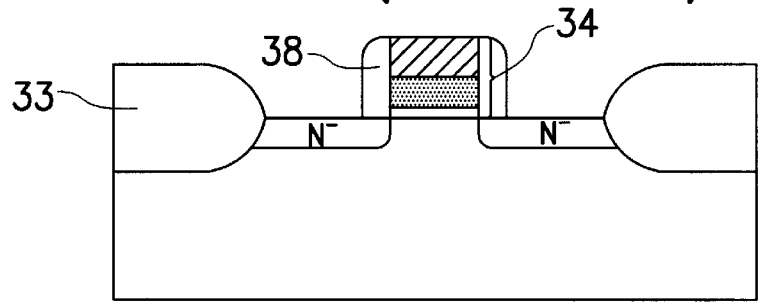
Figure 3D:
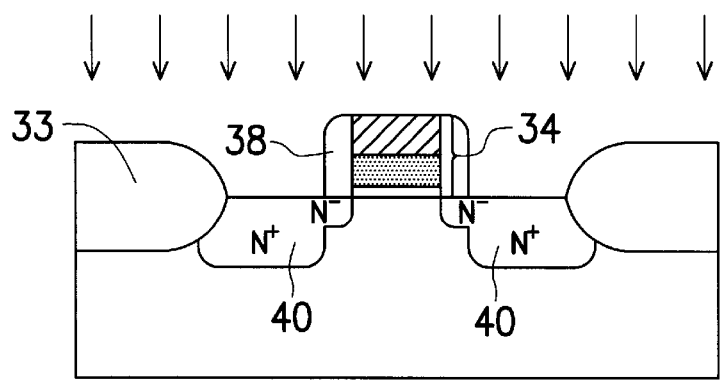
Figure 4A:
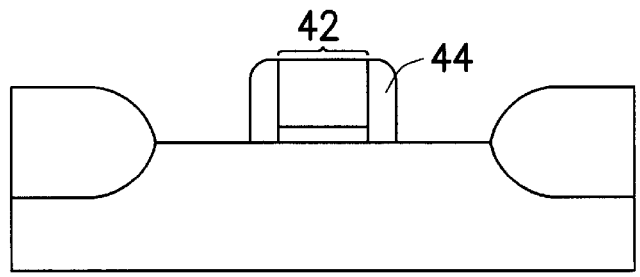
FIGS. 4A through 4D are schematic, sequential cross-sectional diagrams showing a self-aligned suicide process.
Figure 4B:
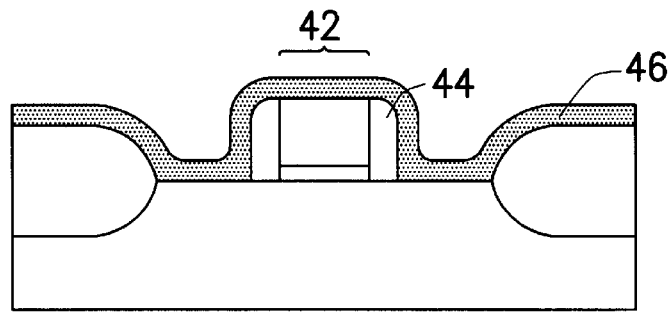
Figure 4C:
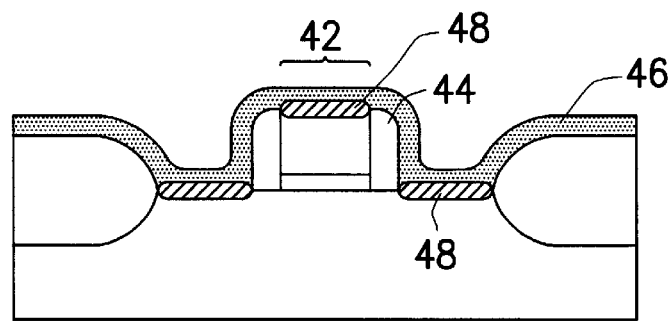
Figure 4D:
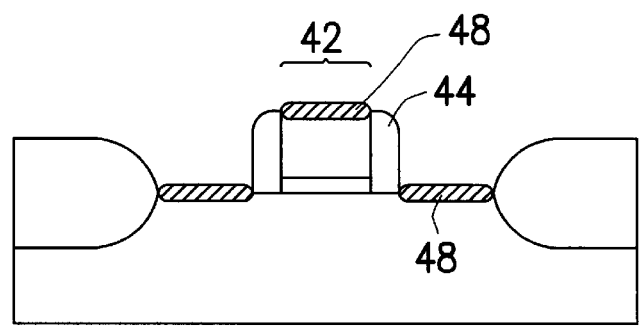

After forming the PNO spacer of the invention, a Salicide process is performed using the PNO spacer of the invention as shown in FIGS. 4A through 4D. As shown in FIG. 4A, a gate 42 and a PNO spacer 44 are provided. As shown in FIG. 4B, a Ti layer 46 about 100–200 Å thick is formed over the wafer by Magnetron DC sputtering. An annealing step is performed on the Ti layer 46 to let Ti react with silicon on the surface of the gate 42 and source/drain regions to form $TiSi_2$ layer 48, as shown in FIG. 4C. A wet etching step is performed to remove the remaining Ti layer 46 and to expose the $TiSi_2$ layer 48, as shown in FIG. 4D. While performance of the annealing step, the $TiSi_2$ layer 48 does not form on the PNO spacer 44, because the PNO spacer 44 does not contain any silicon. Therefore, the PNO spacer 44 can isolate the gate 42 and source/drain regions very well to maintain the MOS device's reliability and increase the MOS device fabrication yield.

Figure 5A:
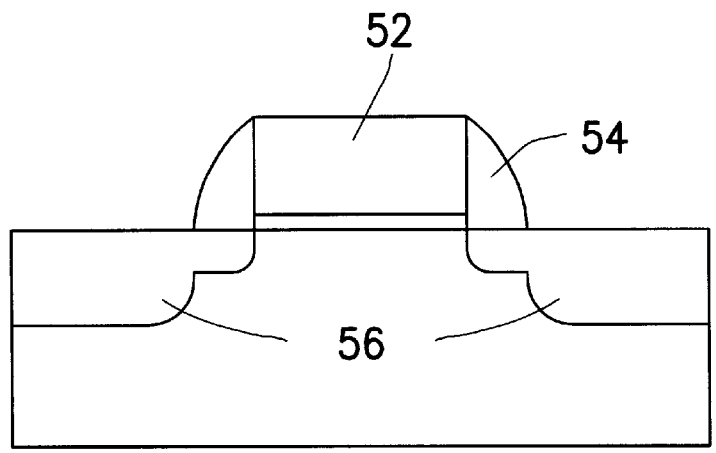
FIGS. 5A and 5B are schematic, sequential cross-sectional diagrams showing a self-aligned contact etching process.
Figure 5B:
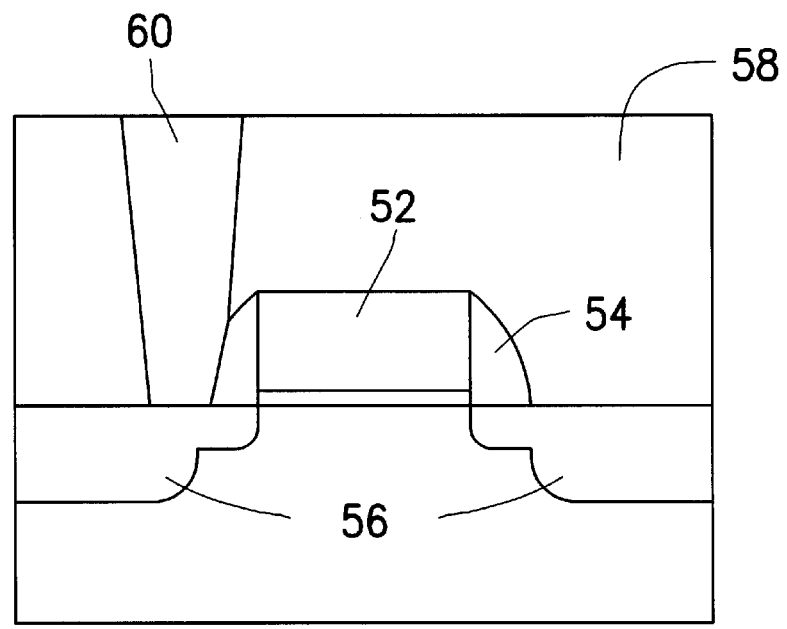

Additionally, performing the self-aligned contact etching process using the PNO spacer of the invention is shown in FIGS. 5A and 5B. As shown in FIG. 5A, a gate 52, a PNO spacer 54 and an LDD source/drain regions 56 are provided. As shown in FIG. 5B, a dielectric layer 58 is deposited over the whole wafer. The material of the dielectric layer 58 is silicon oxide. An etching step and a depositing step are performed on the dielectric layer 58 to form a contact 60 to electrically connect one of the LDD source/drain regions 56. During the process of etching the dielectric layer 58, the PNO spacer 54 is strong enough to avoid erosion by etching, because the breakdown strength of the PNO material (about $10^7$V/cm) is larger than the breakdown strength of silicon oxide (about $10^6$V/cm). Therefore, the PNO spacer 54 is not eroded to improve the MOS device's reliability.

As a summary, the method of fabricating a PNO spacer of the invention includes the following characteristics:

(1) The PNO spacer of the invention contains phosphorous (P), nitrogen (N) and oxygen (O). The PNO spacer does not include any silicon (Si). The breakdown strength of the PNO material (about $10^7$V/cm) is larger than the breakdown strength of silicon oxide (about $10^6$V/cm).

(2) The PNO spacer of the invention avoids forming the $TiSi_2$ layer formed on the PNO spacer. Therefore, the PNO spacer can isolate the gate and source/drain regions very well and thus maintain the MOS device's reliability and increase the MOS device fabrication yield.

(3) The PNO spacer of the invention avoids erosion during etching. Therefore, the PNO spacer can isolate the gate and the contact very well to improve the MOS device's reliability.

(4) The invention provides a PNO material that can be used instead of conventional phosphoric silicon glass (PSG) or silicon nitride to form a covered layer on the integrated circuits in the back end process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an improved spacer comprising:

providing a semiconductor substrate;

forming a conductive layer on the semiconductor substrate, the conductive layer being patterned to expose the semiconductor substrate; and forming a Phoslon spacer on a sidewall of the conductive layer.

2. The method of claim 1, wherein the conductive layer comprises:

a gate oxide layer formed on the semiconductor substrate; and a polycide metal layer formed on the gate oxide layer.

3. The method of claim 2, wherein the polycide metal layer comprises:

a polysilicon layer formed on the gate oxide layer; and a tungsten silicide layer formed on the polysilicon layer.

4. The method of claim 1, wherein the method of forming the Phoslon spacer further comprises:

forming a Phoslon layer on the conductive layer and the semiconductor substrate by deposition; and performing an anisotropic etching step on the Phoslon layer to form the Phoslon spacer.

5. The method of claim 4, wherein the step of forming the Phoslon layer includes chemical vapor deposition (CVD) using $PH_3$, $O_2$, $NH_3$ and $N_2$ as reagents.

6. The method of claim 4, wherein the step of etching the Phoslon layer includes plasma etching using $CF_X+O_2$ as a plasma source.

7. The method of claim 1, wherein the material of the Phoslon spacer is a chemical compound of the form $P_XN_YO_Z$, containing phosphorous (P), nitrogen (N) and oxygen (O).

8. The method of claim 1, wherein the reactive temperature during Phoslon spacer formation is in the range of about 400–900° C.

9. The method of claim 1, wherein the chemical reactive equation during Phoslon spacer formation is as follows: $PH_3+O_2+NH_3+N_2 \rightarrow P_XN_YO_Z+N_2+H_2+$uncertain products.

10. The method of claim 1, wherein the Phoslon spacer does not contain any silicon.

11. A method of fabricating an improved spacer, the method comprising:

providing a semiconductor substrate;

forming a conductive layer on the semiconductor substrate, the conductive layer being patterned to expose the semiconductor substrate;

forming a phoslon spacer on a sidewall of the conductive layer; and forming a silicide layer on the exposed portion of the semiconductor substrate and an exposed portion of the conductive layer, wherein the phoslon spacer serving isolation function.

12. A method of fabricating an improved spacer, the method comprising:

providing a semiconductor substrate;

forming a conductive layer on the semiconductor substrate, the conductive layer being patterned to expose the semiconductor substrate; and forming a silicon-free space on a sidewall of the conductive layer.

13. The method of claim 12, wherein the silicon-free spacer comprises phoslon dielectric layer.

14. The method of claim 12, further comprising:

forming a silicide layer on the exposed portion of the semiconductor substrate and an exposed portion of the conductive layer, wherein the silicon-free spacer serving isolation function.

15. The method of claim 12, wherein the silicon-free spacer comprises phoslon dielectric layer.

* * * * *